United States Patent
Chen et al.

(10) Patent No.: US 9,431,517 B2
(45) Date of Patent: Aug. 30, 2016

(54) SEMICONDUCTOR DEVICE AND METHOD

(71) Applicant: Taiwan Semiconductor Manufacturing Company, Ltd., Hsin-Chu (TW)

(72) Inventors: Hong-Lin Chen, Hsin-Chu (TW);
Shih-Cheng Chen, Taipei (TW);
Ming-Shan Shieh, Hsin-Chu (TW);
Chin-Chi Wang, New Taipei (TW);
Wai-Yi Lien, Hsin-Chu (TW);
Chih-Hao Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/594,001

(22) Filed: Jan. 9, 2015

(65) Prior Publication Data

US 2016/0149019 A1    May 26, 2016

Related U.S. Application Data

(60) Provisional application No. 62/085,182, filed on Nov. 26, 2014.

(51) Int. Cl.
| | |
|---|---|
| *H01L 21/20* | (2006.01) |
| *H01L 29/66* | (2006.01) |
| *H01L 29/78* | (2006.01) |
| *H01L 29/423* | (2006.01) |
| *H01L 27/088* | (2006.01) |

(52) U.S. Cl.
CPC ....... *H01L 29/66666* (2013.01); *H01L 27/088* (2013.01); *H01L 29/42356* (2013.01); *H01L 29/7827* (2013.01)

(58) Field of Classification Search
CPC ............... H01L 21/2018; H01L 21/02603; H01L 29/0669; H01L 29/0665; H01L 51/057
See application file for complete search history.

(56) References Cited

U.S. PATENT DOCUMENTS

| | | | |
|---|---|---|---|
| 9,087,922 B2 | 7/2015 | Sun et al. | |
| 2005/0106800 A1 | 5/2005 | Haensch et al. | |
| 2006/0240622 A1 | 10/2006 | Lee et al. | |
| 2013/0248998 A1* | 9/2013 | Misu | H01L 29/7801 257/335 |

FOREIGN PATENT DOCUMENTS

| | | |
|---|---|---|
| KR | 20050046634 A | 5/2005 |
| KR | 20060110702 A | 10/2006 |
| TW | 201306178 A | 2/2013 |

* cited by examiner

Primary Examiner — Jae Lee
(74) Attorney, Agent, or Firm — Slater Matsil, LLP

(57) ABSTRACT

Vertical gate all around devices are formed by initially forming a first doped region and a second doped region that are planar with each other. A channel layer is formed over the first doped region and the second doped region, and a third doped region is formed over the channel layer. A fourth doped region is formed to be planar with the third doped region, and the first doped region, the second doped region, the third doped region, the fourth doped region, and the channel layer are patterned to form a first nanowire and a second nanowire, which are then used to form the vertical gate all around devices.

20 Claims, 5 Drawing Sheets

SEMICONDUCTOR DEVICE AND METHOD

This applications claims priority to U.S. Provisional Patent Application No. 62/085,182 filed Nov. 26, 2014, and entitled "Semiconductor Device and Method," which application is incorporated herein by reference.

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical GAA transistor enables enhanced control of the charge carriers along the lengthwise direction through a complete encirclement of the channel region of a semiconductor nanowire by a gate dielectric and a gate electrode. The GAA transistor has a reduced short channel effect, because the channel region may be surrounded by the gate electrode so that an effect of the source/drain region on an electric field of the channel region may be reduced.

However, there are challenges to implementation of a VGAA. For example, the processes and methods utilized in complementary metal-oxide-semiconductor (CMOS) fabrication are not specifically tailored for the manufacture of VGAA transistors. As such, improvements are needed in the manufacturing processes in order to manufacture VGAA transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
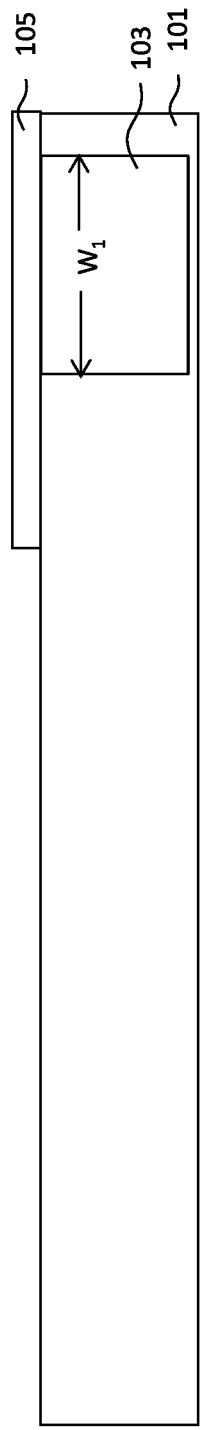
FIG. 1 illustrates a substrate with an alignment mark in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a particular embodiment utilized in vertical gate all around transistors. However, the embodiments may be utilized with any suitable process or device.

With reference now to FIG. 1, there is illustrated a substrate 101, an alignment mark 103, and a first hard mask 105. In an embodiment the substrate 101 comprises a semiconductor substrate (e.g., Si, SiGe, or SiGeB). In alternative embodiments, the substrate 101 comprises a silicon-on-insulator (SOI) structure. In some embodiments, the substrate 101 may comprise a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; or combinations thereof.

The alignment mark 103 may be formed within the substrate 101 in order to provide for a control point that may be used to ensure that the substrate 101 is aligned in a particular fashion for further processing. In an embodiment the alignment mark 103 may be a material that may be seen, either by visual or other inspection, such as silicon dioxide, although any other suitable material may be used. The alignment mark 103 may be formed by initially patterning the substrate 101 to form a trench with, e.g., a photolithographic masking and etching process. Once the trench has been formed, the trench may be filled and/or overfilled with, e.g., silicon dioxide, and any excess material outside of the trench may be removed using, e.g., a planarization process such as a chemical mechanical polish such that the alignment mark has a top surface that is planar with a top surface of the substrate 101. In an embodiment the alignment mark 103 may be formed to have a first width $W_1$ of between about 0.1 µm and about 1.6 µm, such as about 1.1 µm.

Once the alignment mark 103 has been formed within the substrate 101, the first hard mask 105 may be placed over the substrate 101 and the alignment mark 103 in order to form a mask for a subsequent etching of the substrate 101. In an embodiment the first hard mask 105 comprises a dielectric material such as silicon nitride, titanium nitride, silicon oxynitride, combinations of these, or the like. The first hard mask 105 may be formed using a process such as chemical vapor deposition, plasma enhanced chemical vapor deposition, atomic layer deposition, or the like. However, any other suitable material and method of formation may alternatively be utilized. The first hard mask 105 may be formed to a thickness of between about 20 Å and about 3000 Å, such as about 20 Å.

Once the first hard mask 105 has been formed, the first hard mask 105 may be patterned in order to expose a portion of the substrate 101 where a first doped region 203 (not illustrated in FIG. 1 but illustrated and described below with respect to FIG. 2) is intended to be formed. In an embodiment the first hard mask 105 is patterned by initially placing a first photoresist (not individually illustrated) over the first hard mask 105 and exposing the first photoresist to a patterned energy source (e.g. light) in order to initiate a chemical reaction that modifies the physical properties of the exposed portions of the first photoresist. The first photoresist may then be developed by applying a first developer (also not individually illustrated in FIG. 1) in order to utilize the modified physical properties between the exposed region and the unexposed region to selectively remove either the exposed region or the unexposed region.

Once the first photoresist has been patterned, the first photoresist may be used as a mask in order to pattern the underlying first hard mask 105. In an embodiment the first hard mask 105 may be patterned using, e.g., a reactive ion etching process with the first photoresist as a mask. The patterning process may be continued until the substrate 101 is exposed beneath the first hard mask 105.

Figure 2:
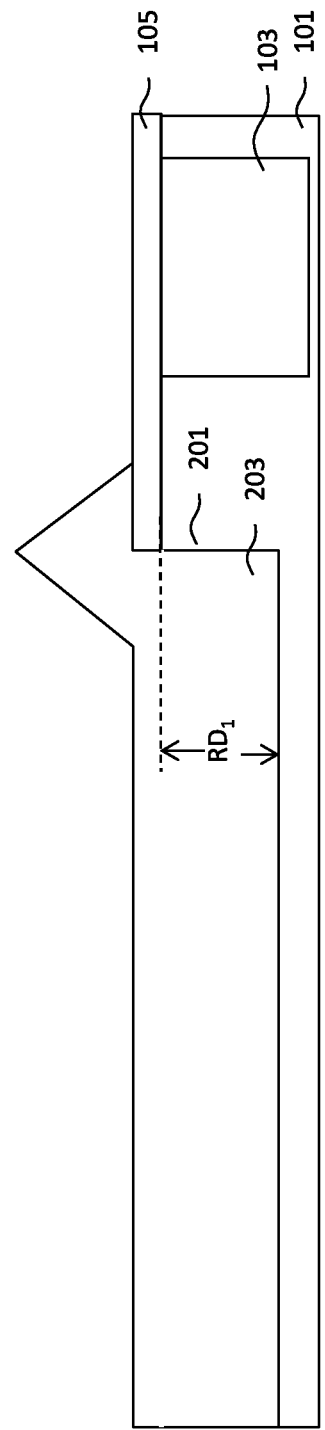
FIG. 2 illustrates a formation of a first doped region in accordance with some embodiments.

FIG. 2 illustrates a patterning of the substrate 101 using the first hard mask 105 to form a first opening 201. In an embodiment the patterning may be performed to transfer the pattern of the first hard mask 105 to the substrate 101 using, e.g., a reactive ion etching process that utilizes etchants suitable for the material of the substrate 101 (e.g., silicon) with the first hard mask 105 as a mask. The first opening 201 may be formed to have a first recessed depth $RD_1$ of between about 50 nm and about 90 nm, such as about 64 nm.

After the first opening 201 has been formed within the substrate 101, the first opening 201 may be filled to form the first doped region 203. In an embodiment the first doped region 203 will be used to form first vertical gate all around (VGAA) devices 1000 (not fully illustrated in FIG. 2 but illustrated and described below with respect to FIG. 10). In a particular embodiment the first doped region 203 is utilized to form source/drain regions for the first VGAA devices 1000 and, as such, comprises a semiconductor material such as silicon that also comprises dopants that will cause the semiconductor material of the first doped region 203 to have a first conductivity. However, any suitable semiconductor materials, such as germanium, silicon germanium, combinations of these, or the like, may alternatively be utilized.

The first doped region 203 may be formed using a process such as epitaxial growth that utilizes exposed regions of the substrate 101 as a growth initiator. For example, in some embodiments the first doped region 203 may be formed using a process such as metal-organic CVD (MOCVD), molecular beam epitaxy (MBE), liquid phase epitaxy (LPE), vapor phase epitaxy (VPE), selective epitaxial growth (SEG), the like, or a combination thereof. Because the first doped region 203 is epitaxially grown on the exposed portions of the substrate 101, the first doped region 203 will grow on the exposed portions of the substrate 101 (within the first opening 201), but growth will not be initiated over the first hard mask 105. Additionally, the first doped region 203 will have a similar lattice constant as the underlying substrate 101 upon which it the first doped region 203 is grown.

To be used as a source/drain region, the first doped region 203 is doped with a dopant that is suitable for use with the type of device to be formed from the first doped region 203. For example, in an embodiment in which NMOS devices are desired to be formed from the first doped region 203, the first doped region 203 may be doped with N-type dopants such as phosphorous or arsenic. Alternatively, if PMOS devices are desired to be formed from the first doped region 203, P-type dopants such as boron or gallium may be used.

In an embodiment the dopants are introduced to the material of the first doped region 203 (e.g., silicon) as the first doped region 203 is grown. For example, during the epitaxial growth process, precursors that comprise the desired dopants are placed in situ into the reaction vessel along with the precursor reactants for the material of the first doped region 203. As such, the dopants are introduced to the material of the first doped region 203 and are incorporated into the material of the first doped region 203 to provide the first doped region 203 the desired conductivity.

Alternatively, the dopants may be introduced after the material of the first doped region 203 (e.g., the silicon) has been grown. In this embodiment the material of the first doped region 203 is grown without the dopants, and an introduction process such as an implantation process or diffusion process is utilized to introduce the dopants into the first doped region 203. Once the dopants have been introduced, an anneal may be performed to activate the dopants.

The epitaxial growth process may be continued at least until the first opening 201 has been filled with the material of the first doped region 203. Additionally, to ensure a complete filling of the first opening 201, the growth process may be continued to overfill the first opening 201 as well. Such an overfilling will result in the growth of the first doped region to also proceed laterally (e.g., parallel with a surface of the substrate 101) such that an extension of the first doped region 203 will partially extend over a portion of the first hard mask 105.

Figure 3:
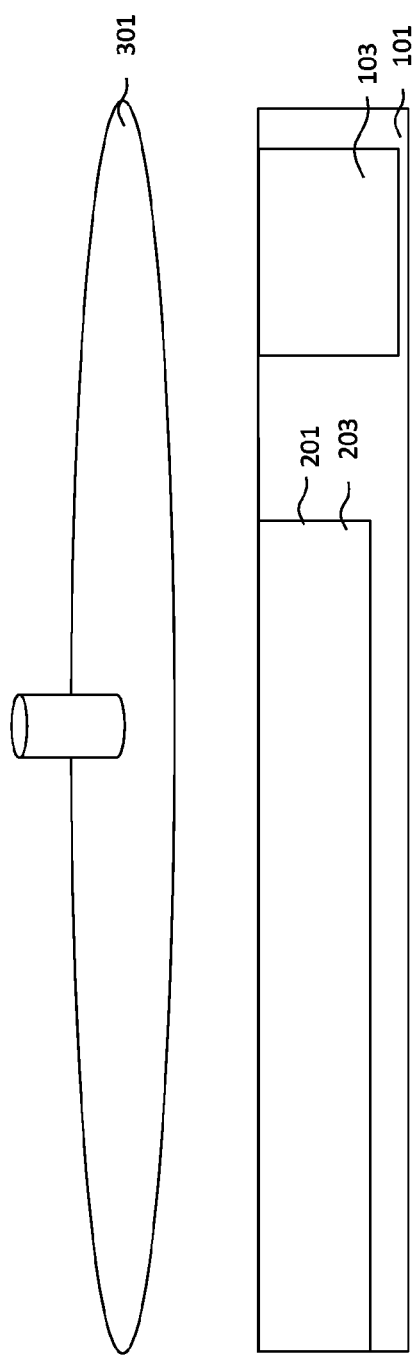
FIG. 3 illustrates a planarization of the first doped region in accordance with an embodiment.

FIG. 3 illustrates a first planarization process (represented in FIG. 3 by the platen labeled 301) which is utilized to planarize the first doped region 203 and to remove the first hard mask 105. In an embodiment the first planarization process 301 is one or more chemical mechanical polishing processes, in which etchants and abrasives are applied to the first doped region 203 and the first hard mask 105 and the first doped region 203 and the first hard mask 105 are ground with a platen in order to planarize and remove excess regions of the first doped region 203 and the first hard mask 105 that are located above a surface of the substrate 101.

However, as one of ordinary skill in the art will recognize, the chemical mechanical polishing process described above is intended to be illustrative and is not intended to be limiting upon the embodiments. Rather, any suitable planarization process, such as a physical grinding process or a series of one or more etches, may alternatively be utilized for the first planarization process 301. All such processes are fully intended to be included within the scope of the embodiments.

Figure 4:
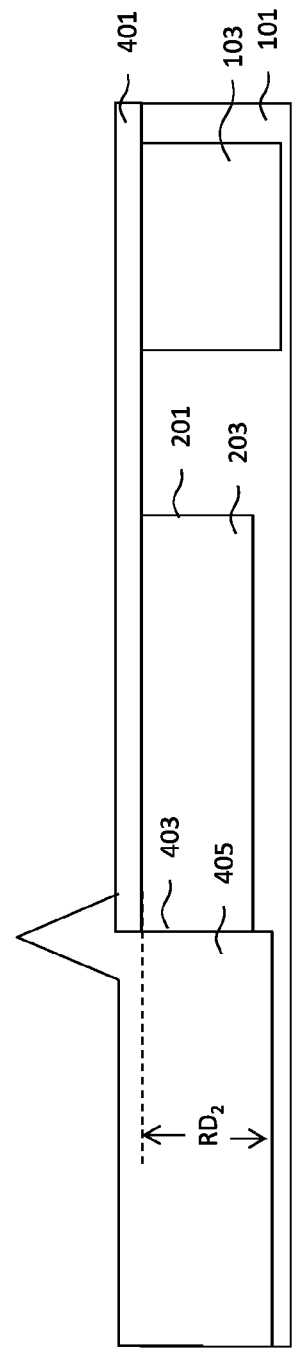
FIG. 4 illustrates a formation of a second doped region in accordance with an embodiment.

FIG. 4 illustrates a deposition of a second hard mask 401 over the substrate 101, the alignment mark 103, and the first doped region 203. In an embodiment the second hard mask 401 comprises a dielectric material such as silicon nitride, titanium nitride, silicon oxynitride, combinations of these, or the like. The second hard mask 401 may be formed using a process such as chemical vapor deposition, plasma enhanced chemical vapor deposition, atomic layer deposition, or the like. However, any other suitable material and method of formation may alternatively be utilized. The second hard mask 401 may be formed to a thickness of between about 20 Å and about 3000 Å, such as about 20 Å.

Once the second hard mask 401 has been formed, the second hard mask 401 may be patterned in order to expose a portion of the first doped region 203 where a second doped region 405 is intended to be formed. In an embodiment the second hard mask 401 is patterned by initially placing a second photoresist (not individually illustrated in FIG. 4) over the second hard mask 401 and exposing the second photoresist to a patterned energy source (e.g. light) in order to initiate a chemical reaction that modifies the physical properties of the exposed portions of the second photoresist. The second photoresist may then be developed by applying a second developer (also not individually illustrated in FIG. 4) in order to utilize the modified physical properties between the exposed region and the unexposed region to selectively remove either the exposed region or the unexposed region.

Once the second photoresist has been patterned, the second photoresist may be used as a mask in order to pattern the underlying second hard mask 401. In an embodiment the second hard mask 401 may be patterned using, e.g., a reactive ion etching process with the second photoresist as a mask. The patterning process may be continued until the first doped region 203 is exposed beneath the second hard mask 401.

After the second hard mask 401 has been formed and patterned, a portion of the first doped region 203 may be removed using the second hard mask 401 to form a second opening 403. In an embodiment the second opening 403 may be formed by transferring the pattern of the second hard mask 401 to the first doped region 203 using, e.g., a reactive ion etching process that utilizes etchants suitable for the material of the first doped region 203 (e.g., silicon) with the second hard mask 401 as a mask. The second opening 403 may be formed to expose the underlying substrate 101, such as by having a second recessed depth $D_2$ of between about 60 nm and about 90 nm, such as about 75 nm.

After the second opening 403 has been formed within the first doped region 203 and the substrate 101, the second opening 403 may be filled to form the second doped region 405. In an embodiment the second doped region 405 will be used to form second VGAA devices 1001 (not illustrated in FIG. 4 but illustrated and described below with respect to FIG. 10) that are different from the first VGAA devices 1000. In a particular embodiment, the second doped region 405 is utilized to form source/drain regions of the second VGAA devices 1001 that have a different conductivity than the first VGAA devices 1000. For example, if the first VGAA devices 1000 are NMOS devices, the second VGAA devices 1001 are PMOS devices.

The second doped region 405 may be formed using a growth process that utilizes exposed regions of the substrate 101 as a growth initiator. For example, in some embodiments the second doped region 405 may be formed of a semiconductor material such as silicon using a process such as epitaxial growth. For example, in some embodiments the second doped region 405 may be formed using a process such as metal-organic CVD (MOCVD), molecular beam epitaxy (MBE), liquid phase epitaxy (LPE), vapor phase epitaxy (VPE), selective epitaxial growth (SEG), the like, or a combination thereof. However, any suitable semiconductor material, such as germanium, silicon germanium, combinations of these, or the like, may alternatively be utilized.

Because the second doped region 405 is epitaxially grown on the exposed portions of the substrate 101, the second doped region 405 will grow on the exposed portions of the substrate 101 (within the second opening 403), but growth will not be initiated over the second hard mask 401. Additionally, the second doped region 405 will have a similar lattice constant as the underlying substrate 101 upon which it the second doped region 405 is grown.

In an embodiment the second doped region 405 is doped with a dopant that has an opposite conductivity than the first doped region 203. For example, in an embodiment in which an NMOS device is desired to be formed from the first doped region 203 and a PMOS device is desired to be formed from the second doped region 405, the second doped region 405 may be doped with a P-type dopant such as boron or gallium. Alternatively, if it is desired to form a NMOS device from the second doped region 405, N-type dopants such as boron or gallium may be used.

In an embodiment the dopants are introduced to the material of the second doped region 405 (e.g., silicon) as the second doped region 405 is grown. For example, during the epitaxial growth process, precursors that comprise the desired dopants are placed in situ into the reaction vessel along with the precursor reactants for the material of the second doped region 405. As such, the dopants are introduced to the material of the second doped region 405 and are incorporated into the material of the second doped region 405 to provide the second doped region 405 the desired conductivity.

Alternatively, the dopants may be introduced after the material of the second doped region 405 (e.g., the silicon) has been grown. In this embodiment the material of the second doped region 405 is grown undoped, and an introduction process such as an implantation process or diffusion process is utilized to introduce the dopants into the second doped region 405. Once the dopants have been introduced, an anneal may be performed to activate the dopants within the second doped region 405.

The epitaxial growth process may be continued at least until the second opening 403 has been filled with the material of the second doped region 405. Additionally, to ensure a complete filling of the second opening 403, the growth process may be continued to overfill the second opening 403 as well. Such an overfilling will result in an extension of the second doped region 405 partially extending over the second hard mask 401.

Figure 5:
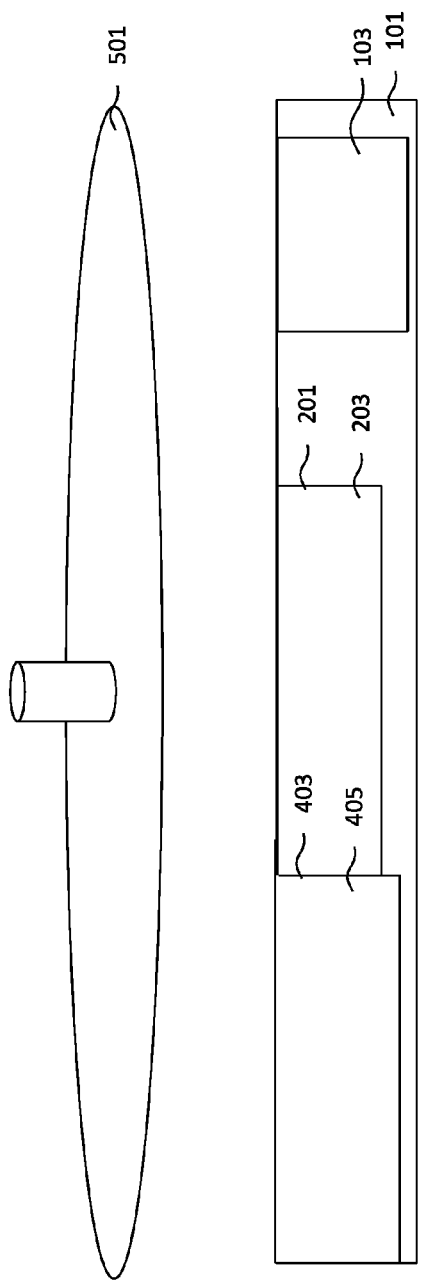
FIG. 5 illustrates a planarization of the second doped region in accordance with an embodiment.

FIG. 5 illustrates a second planarization process (represented in FIG. 5 by the platen labeled 501) which is utilized to planarize the second doped region 405 and to remove the second hard mask 401. In an embodiment the second planarization process 501 is one or more chemical mechanical polishing processes, in which etchants and abrasives are applied and the second doped region 405 and the second hard mask 401 are ground with a platen in order to planarize and remove excess regions of the second doped region 405 and the second hard mask 401 outside of the substrate 101 and the first doped region 203.

However, as one of ordinary skill in the art will recognize, the chemical mechanical polishing process described above is intended to be illustrative and is not intended to be limiting upon the embodiments. Rather, any suitable planarization process, such as a physical grinding process or a series of one or more etches, may alternatively be utilized for the second planarization process 501. All such processes are fully intended to be included within the scope of the embodiments.

Figure 6:
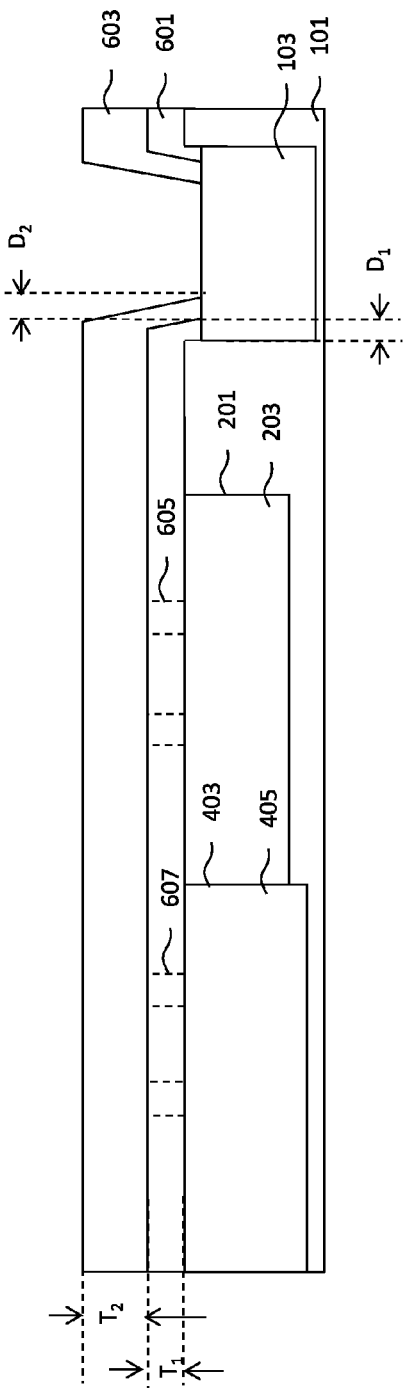
FIG. 6 illustrates a formation of a channel layer and a third doped region in accordance with an embodiment.

FIG. 6 illustrates a formation of a channel layer 601 as well as a formation of a third doped region 603 over the channel layer 601. In an embodiment the channel layer 601 may be a semiconductor material such as silicon formed using a process such as epitaxial growth. For example, in some embodiments the channel layer 601 may be formed using a process such as metal-organic CVD (MOCVD), molecular beam epitaxy (MBE), liquid phase epitaxy (LPE), vapor phase epitaxy (VPE), selective epitaxial growth (SEG), the like, or a combination thereof. However, any suitable semiconductor material, such as germanium, silicon germanium, combinations of these, or the like, may alternatively be utilized.

Because the channel layer 601 is formed using an epitaxial growth process, the channel layer 601 is grown on the first doped region 203, the second doped region 405, and exposed portions of the substrate 101. However, the channel layer 601 does not grow on top of the alignment mark 103, although lateral growth (parallel with a major surface of the substrate 101) will cause a portion of the channel layer 601 to extend over the alignment mark 103. In an embodiment, the channel layer 601 may be grown to have a first thickness $T_1$ of between about 15 nm and about 40 nm, such as about 30 nm and extend a first distance $D_1$ of between about 15 nm and about 40 nm, such as about 30 nm, past an edge of the alignment mark 103.

In an embodiment the channel layer 601 may be grown without the presence of dopants (either n-type or p-type). As such, material for a first channel region (represented in FIG. 6 by the dashed line labeled 605) for the first VGAA device 1000 may be located within the channel layer 601 over the first doped region 203. Additionally, a second channel region (represented in FIG. 6 by the dashed line labeled 607) may be located within the channel layer 601 over the second doped region 405. Both of the first channel region 605 and the second channel region 607 may be formed without dopants.

Alternatively, if desired, the channel layer 601 may be doped as desired by utilizing a masking and implantation process. For example, a mask such as a photoresist may be placed over a portion of the channel layer 601 located above the first doped region 203 and dopants with an opposite conductivity than the second doped region 405 may be implanted into the channel layer 601 over the second doped region 405. The mask may then be removed, a second mask may be placed over a portion of the channel layer 601 located over the second doped region 405, and an implantation process may be used to implant dopants into the channel layer 601 over the first doped region 203. Any suitable process for doping the channel layer 601 may alternatively be utilized.

Additionally, during the epitaxial growth of the channel layer 601, the materials of the substrate 101, the first doped region 203, and the second doped region 405 may be partially extended upwards as some of the materials of the substrate 101, the first doped region 203, and the second doped region 405 diffuse upwards during the process. As such, the substrate 101, the first doped region 203, and the second doped region 405 may be viewed as growing slightly before the channel layer 601. This, along with portions of the alignment mark being consumed by the silicon recessing and surface cleaning processes, results in the surface of the alignment mark 103 being slightly recessed below the surface of the substrate 101 and the channel layer 601 lining a portion of the recess.

Once the channel layer 601 has been formed, the third doped region 603 is formed over the channel layer 601. In an embodiment the third doped region 603 is complementary to the first doped region 203 such that the third doped region 603 and the first doped region 203 may be used as source/drain regions for the first VGAA devices 1000. As such, the third doped region 603 has the same conductivity as the first doped region 203. For example, in an embodiment in which the first doped region 203 is doped with N-type dopants, the third doped region 603 should similarly be doped with N-type dopants. Similarly, if the first doped region 203 is doped with P-type dopants, the third doped region 603 should similarly be doped with P-type dopants.

The third doped region 603 may be formed using a process such as epitaxial growth that utilizes exposed regions of the channel layer 601 as a growth initiator. For example, in some embodiments the third doped region 603 may be formed of a semiconductor material such as silicon using a process such as metal-organic CVD (MOCVD), molecular beam epitaxy (MBE), liquid phase epitaxy (LPE), vapor phase epitaxy (VPE), selective epitaxial growth (SEG), the like, or a combination thereof. However, any suitable semiconductor material, such as germanium, silicon germanium, combinations of these, or the like, may alternatively be utilized.

Because the third doped region 603 is epitaxially grown, the third doped region 603 will grow on the exposed portions of the channel layer 601 but growth will not occur over the alignment mark 103. However, growth will occur on those portions of the channel layer 601 that extends over the alignment mark 103, thereby extending the third doped region 603 partially over the alignment mark 103 and within the recess over the alignment mark 103. Additionally, the third doped region 603 will have a similar lattice constant as the underlying channel layer 601 upon which the third doped region 603 is grown. The third doped region 603 may be formed to a second thickness $T_2$ of between about 30 nm and about 60 nm, such as about 45.5 nm and extend a second distance $D_2$ of between about 30 nm and about 60 nm, such as about 45.5 nm, past the channel layer 601.

In an embodiment the dopants are introduced to the material of the third doped region 603 (e.g., silicon) as the third doped region 603 is grown. For example, during the epitaxial growth process, precursors that comprise the desired dopants are placed in situ into the reaction vessel along with the precursor reactants for the material of the third doped region 603. As such, the dopants are introduced to the material of the third doped region 603 and are incorporated into the material of the third doped region 603 to provide the third doped region 603 the desired conductivity.

Alternatively, the dopants may be introduced after the material of the third doped region 603 (e.g., the silicon) has been grown. In this embodiment the material of the third doped region 603 is grown, and an introduction process such as an implantation process or diffusion process is utilized to introduce the dopants into the third doped region 603. Once the dopants have been introduced, an anneal may be performed to activate the dopants within the third doped region 603.

Figure 7:
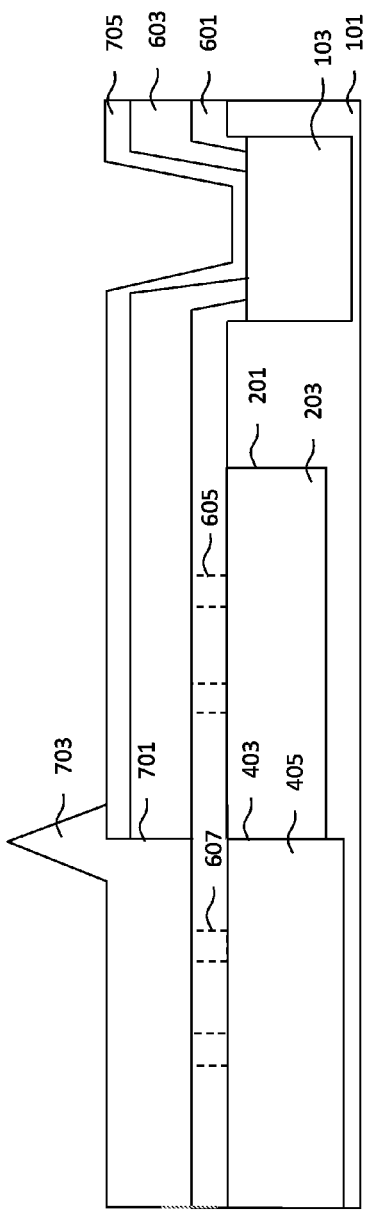
FIG. 7 illustrates a formation of a fourth doped region in accordance with an embodiment.

FIG. 7 illustrates a placement of a third hard mask 705, a patterning of the third doped region 603 to form a third opening 701, and a formation of a fourth doped region 703. In an embodiment the third hard mask 705 comprises a dielectric material such as silicon nitride, titanium nitride, silicon oxynitride, combinations of these, or the like. The third hard mask 705 may be formed using a process such as chemical vapor deposition, plasma enhanced chemical vapor deposition, atomic layer deposition, or the like. However, any other suitable material and method of formation may alternatively be utilized. The third hard mask 705 may be formed to a thickness of between about 20 Å and about 3000 Å, such as about 20 Å.

Once the third hard mask 705 has been formed, the third hard mask 705 may be patterned in order to expose a portion of the third doped region 603 where the fourth doped region 703 is intended to be formed. In an embodiment the third hard mask 705 is patterned by initially placing a third photoresist (not individually illustrated in FIG. 7) over the third hard mask 705 and exposing the third photoresist to a patterned energy source (e.g. light) in order to initiate a chemical reaction that modifies the physical properties of the exposed portions of the third photoresist. The third photoresist may then be developed by applying a third developer (also not individually illustrated in FIG. 7) in order to utilize the modified physical properties between the exposed region and the unexposed region to selectively remove either the exposed region or the unexposed region.

Once the third photoresist has been patterned, the third photoresist may be used as a mask in order to pattern the underlying third hard mask 705. In an embodiment the third hard mask 705 may be patterned using, e.g., a reactive ion etching process with the third photoresist as a mask. The patterning process may be continued until the third doped region 603 is exposed beneath the third hard mask 705.

After the third hard mask 705 has been formed and patterned, a portion of the third doped region 603 may be removed using the third hard mask 705 to form a third opening 701. In an embodiment the third opening 701 may be formed by transferring the pattern of the third hard mask 705 to the third doped region 603 using, e.g., a reactive ion etching process that utilizes etchants suitable for the material of the third doped region 603 (e.g., silicon) with the third hard mask 705 as a mask. The third opening 701 may be formed to expose an underlying portion of the channel layer 601.

Once the third opening 701 has been formed, the fourth doped region 703 is formed within the third opening over the channel layer 601. In an embodiment the fourth doped region 703 is complementary to the second doped region 405 such that the fourth doped region 703 and the second doped region 405 may be used as source/drain regions for the second VGAA devices 1001. As such, the fourth doped region 703 has the same conductivity as the second doped region 405. For example, in an embodiment in which the second doped region 405 is doped with P-type dopants, the fourth doped region 703 is similarly be doped with P-type dopants. Similarly, if the second doped region 405 is doped with N-type dopants, the fourth doped region 703 is similarly be doped with N-type dopants.

The fourth doped region 703 may be formed using a process such as epitaxial growth that utilizes exposed regions of the channel layer 601 within the third opening 701 as a growth initiator. For example, in some embodiments the fourth doped region 703 may be formed of a semiconductor material such as silicon using a process such as metal-organic CVD (MOCVD), molecular beam epitaxy (MBE), liquid phase epitaxy (LPE), vapor phase epitaxy (VPE), selective epitaxial growth (SEG), the like, or a combination thereof. However, any suitable semiconductor material, such as germanium, silicon germanium, combinations of these, or the like, may alternatively be utilized.

Because the fourth doped region 703 is epitaxially grown, the fourth doped region 703 will grow on the exposed portions of the channel layer 601, but growth will not be initiated over the third hard mask 705. Additionally, the fourth doped region 703 will have a similar lattice constant as the underlying channel layer 601 upon which the fourth doped region 703 is grown.

The epitaxial growth process for the fourth doped region 703 is continued until at least the third opening 701 has been filled with the material of the fourth doped region 703. Additionally, to ensure a complete filling of the third opening 701, the growth process of the fourth doped region 703 may be continued to overfill the third opening 701 as well. Such an overfilling will result in an extension of the fourth doped region 703 over the third hard mask 705.

In an embodiment the dopants are introduced to the material of the fourth doped region 703 (e.g., silicon) as the fourth doped region 703 is grown. For example, during the epitaxial growth process, precursors that comprise the desired dopants are placed in situ into the reaction vessel along with the precursor reactants for the material of the fourth doped region 703. As such, the dopants are introduced to the material of the fourth doped region 703 and are incorporated into the material of the fourth doped region 703 to provide the fourth doped region 703 the desired conductivity.

Alternatively, the dopants may be introduced after the material of the fourth doped region 703 (e.g., the silicon) has been grown. In this embodiment the material of the fourth doped region 703 is grown, and an introduction process such as an implantation process or diffusion process is utilized to introduce the dopants into the fourth doped region 703. Once the dopants have been introduced, an anneal may be performed to activate the dopants within the fourth doped region 703.

Figure 8:
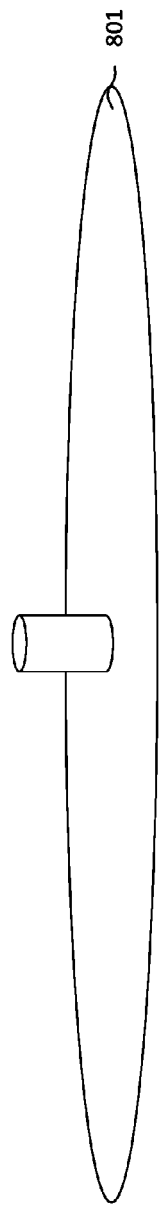
FIG. 8 illustrates a planarization of the fourth doped region in accordance with an embodiment.

FIG. 8 illustrates a third planarization process (represented in FIG. 8 by the platen labeled 801) which is utilized to planarize the fourth doped region 703 and to remove the third hard mask 705. In an embodiment the third planarization process 801 is one or more chemical mechanical polishing processes, in which etchants and abrasives are applied and the fourth doped region 703 and the third hard mask 705 are ground with a platen in order to planarize and remove excess regions of the fourth doped region 703 and the third hard mask 705.

However, as one of ordinary skill in the art will recognize, the chemical mechanical polishing process described above is intended to be illustrative and is not intended to be limiting upon the embodiments. Rather, any suitable planarization process, such as a physical grinding process or a series of one or more etches, may alternatively be utilized for the third planarization process 801. All such processes are fully intended to be included within the scope of the embodiments.

By utilizing the growth processes and planarization processes as described above, variations that would normally occur as a channel layer is formed within a recess of a substrate may be avoided. In particular, non-conformal facet defects that typically occur near a pattern boundary that would normally cause the channel layers to not be planar along the pattern boundary are avoided by utilizing the planarization processes to ensure that the underlying surfaces are planar prior to the start of the formation of subsequent layers. As such, by avoiding such defects, the overall amount of area necessary to avoid device failure because of such defects may be reduced, and the overall density of devices that utilize nanowires (e.g., SRAM cells that use vertical devices with a heavy N/P doping source/drain and a vertical channel) may be reduced.

Figure 9:
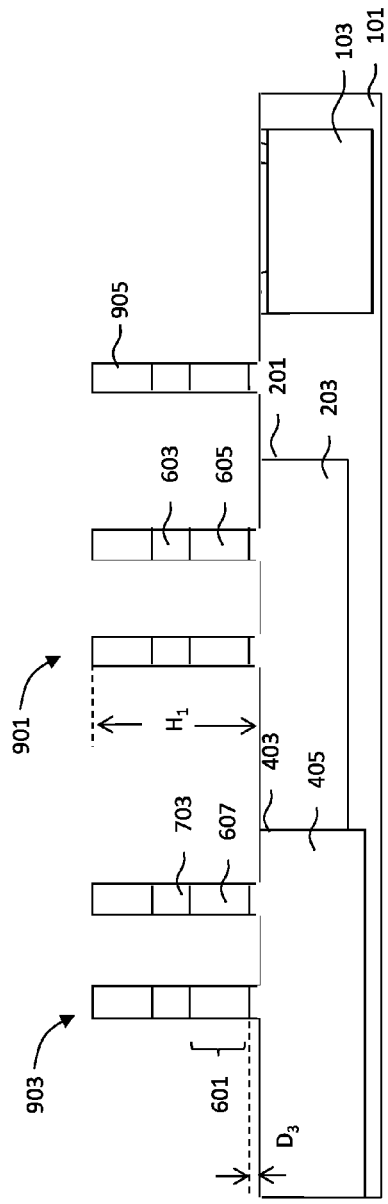
FIG. 9 illustrates a formation of a first nanowire and a second nanowire in accordance with an embodiment.

FIG. 9 illustrates a patterning of the channel layer 601, the third doped region 603, and the fourth doped region 703 into first nanowires 901 (formed from the channel layer 601, the third doped region 603 and the first doped region 203) and second nanowires 903 (formed from the fourth doped region 703, the channel layer 601 and the second doped region 405). In an embodiment the channel layer 601, the first doped region 203, the second doped region 405, the third doped region 603, and the fourth doped region 703 may be patterned by initially applying a fourth photoresist 905 to the third doped region 603 and the fourth doped region 703 and exposing the fourth photoresist 905 to a patterned energy source (e.g. light) in order to initiate a chemical reaction that modifies the physical properties of the exposed portions of the fourth photoresist 905. The fourth photoresist 905 may then be developed by applying a fourth developer (not individually illustrated in FIG. 9) in order to utilize the modified physical properties between the exposed region and the unexposed region to selectively remove either the exposed region or the unexposed region.

Once the fourth photoresist 905 has been patterned, the fourth photoresist 905 may be used as a mask in order to pattern the underlying fourth doped region 703, the third doped region 603, the channel layer 601, the second doped region 405, and the first doped region 203 into the first nanowires 901 (from the first doped region 203, the first channel region 605 within the channel layer 601, and the third doped region 603) and the second nanowires 903 (from the second doped region 405, the second channel region 607 within the channel layer 601, and the fourth doped region 703). In an embodiment the fourth doped region 703, the third doped region 603, the channel layer 601, the second doped region 405, and the first doped region 203 may be patterned using, e.g., one or more reactive ion etching processes with the fourth photoresist 905 as a mask. The patterning process may be continued until the first doped region 203 and the second doped region 405 have been exposed beneath the channel layer 601. The first nanowires 901 and the second nanowires 903 may be formed to have a width of between about 5 nm and about 10 nm, such as about 6 nm.

Additionally, if desired, the patterning process may be continued into the first doped region 203 and the second doped region 405. In an embodiment the patterning process is continued to remove the first doped region 203 and the second doped region 405 to a third depth $D_3$ of between about 5 nm and about 10 nm, such as about 7.5 nm. As such, the first nanowires 901 and the second nanowires 903 may be formed to have a first height $H_1$ of between about 50 nm and about 100 nm, such as about 72 nm.

In some embodiments, a dummy bar 911 may also be formed along with the first nanowires 901 and the second nanowires 903. The dummy bar 911 may be formed in order to equalize the density of the nanowires formed so that processing variations do not unduly affect the final product. In an embodiment the dummy bar 911 may be formed to have similar dimensions as the first nanowire 901 and the second nanowire 903. For example, the dummy bar 911 may be formed to have a width of between about 5 nm and about 10 nm, such as about 6 nm, although any suitable dimensions may alternatively be utilized.

Once the first nanowires 901 and the second nanowires 903 have been formed, the fourth photoresist 905 is removed using a process such as ashing, whereby the temperature of the fourth photoresist 905 is increased until the fourth photoresist 905 thermally decomposes. Next, a cleaning may be performed to remove a native oxide of the first nanowires 901 and the second nanowires 903. The cleaning may be performed using diluted hydrofluoric (DHF) acid.

Figure 10:
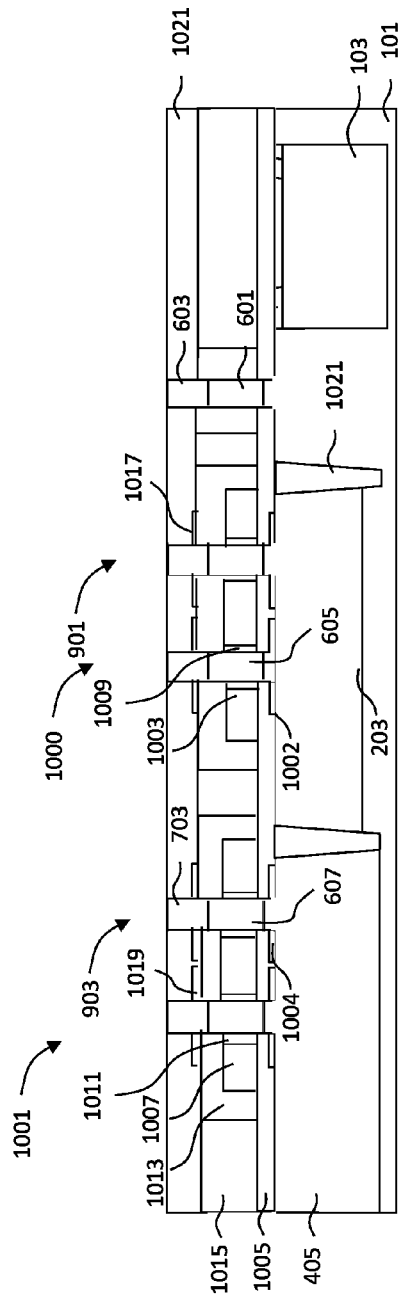
FIG. 10 illustrates a formation of a first vertical gate all around device and a second vertical gate all around device in accordance with an embodiment.

FIG. 10 illustrates that, once the first nanowires 901 and the second nanowires 903 have been formed, the first VGAA devices 1000 and the second VGAA devices 1001 may be formed from the first nanowires 901 and the second nanowires 903. The process may be started by initially forming substrate isolation regions 1023 around the first doped region 203 and the second doped region 405 in order to isolate these regions from each other. In an embodiment the substrate isolation regions 1023 includes a dielectric material, such as silicon oxide. The substrate isolation regions 1023 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using chemical vapor deposition (CVD), physical vapor deposition (PVD), or spin-on process, performing a CMP process to remove a portion of the dielectric material above the first nanowires 901 and the second nanowires 903, and etching back the dielectric material to the desired height to help define the substrate isolation regions 1023.

Once the substrate isolation regions 1023 have been formed, first contact pads 1002 are formed to provide electrical connection to the first doped region 203 and second contact pads 1004 are formed to provide electrical connection to the second doped region 405. In an embodiment the first contact pads 1002 and the second contact pads 1004 are formed of a conductive material such as aluminum, although other suitable materials, such as copper, tungsten, or the like, may alternatively be utilized. The first contact pads 1002 and the second contact pads 1004 may be formed using a process such as CVD or PVD, although other suitable materials and methods may alternatively be utilized. Once the material for the first contact pads 1002 and the second contact pads 1004 has been deposited, the material may be shaped into the first contact pads 1002 and the second contact pads 1004 using, e.g., one or more photolithographic masking and etching processes.

Once the first contact pads 1002 and the second contact pads 1004 have been formed, a first isolation region 1005 is formed to isolate the first doped region 203 and the second doped region 405 from the subsequently formed first gate electrode 1003 and the second gate electrode 1007 and second gate electrode 1007. In an embodiment the first isolation region 1005 is formed over the first contact pads 1002 and the second contact pads 1004 and the first doped region 203 and the second doped region 405 and provides isolation function to and properly configures various features of the first VGAA devices 1000 and the second VGAA devices 1001. In an embodiment the first isolation region 1005 includes a dielectric material, such as silicon oxide. The first isolation region 1005 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using chemical vapor deposition (CVD), physical vapor deposition (PVD), or spin-on process, performing a CMP process to remove a portion of the dielectric material above the first nanowires 901 and the second nanowires 903, and etching back the dielectric material to the desired height to help define the first isolation region 1005.

Once the first isolation region 1005 has been formed, first gate dielectrics 1009 and a first gate electrode 1003 are formed surrounding the first channel region 605 within the first nanowires 901 and second gate dielectrics 1011 and a second gate electrode 1007 are formed surrounding the second channel region 607 within the second nanowire 903. In some embodiments, the first gate dielectric 1009 and the second gate dielectric 1011 may include silicon oxide, silicon nitride, silicon oxynitride, or high-k dielectrics, such as metal oxides. Examples of metal oxides that may be used as high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the first gate dielectrics 1009 and the second gate dielectrics 1011 are high-k dielectric layers with a thickness in the range of about 5 to 30 angstroms. The first gate dielectrics 1009 and the second gate dielectrics 1011 may be formed using a suitable process such as atomic layer deposition (ALD), chemical vapor deposition (CVD), physical vapor deposition (PVD), thermal oxidation, UV-ozone oxidation, or combinations thereof. The first gate dielectrics 1009 and the second gate dielectrics 1011 may further comprise interfacial layers (not shown) to reduce damage between the first gate dielectrics 1009 and the second gate dielectrics 1011 and the channel layer 601 of the first nanowires 901 and the second nanowires 903. The interfacial layers may comprise silicon oxide.

Once the first gate dielectrics 1009 and the second gate dielectrics 1011 have been formed, the first gate electrode 1003 and the second gate electrode 1007 may be formed. In an embodiment the first gate electrode 1003 and the second gate electrode 1007 may be formed by initially forming a layer of metal (not separately illustrated in FIG. 10) over the first gate dielectrics 1009 and the second gate dielectrics 1011. In some embodiments, the layer of metal may comprise a single layer or a multilayer structure. In the present embodiment, the layer of metal may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer comprises a uniform thickness in the range of about 1 nanometer to about 20 nanometers. The layer of metal may be formed using a suitable process such as ALD, CVD, PVD, plating, or combinations thereof.

Once the layer of metal has been formed, the layer of metal may be patterned to separate the first gate electrode 1003 and the second gate electrode 1007 by being selectively etched. In an embodiment the layer of metal may be patterned to form the first gate electrode 1003 and the second gate electrode 1007 by initially applying a fifth photoresist (not separately illustrated in FIG. 10) and then patterning the fifth photoresist to expose a portion of the layer of metal that is desired to be removed and to cover a portion of the layer of metal that is desired to remain.

After patterning the fifth photoresist to expose the layer of metal, the layer of metal is etched using the fifth photoresist as a mask. In some embodiments, partially removing the exposed portion of the layer of metal is performed using, e.g., a reactive ion etch process. Once the layer of metal has been patterned into the first gate electrode 1003 and the second gate electrode 1007, the fifth photoresist is removed using a process such as, e.g., ashing.

Once the first gate electrode 1003 and the second gate electrode 1007 have been formed, a third isolation region 1013 may be formed to isolate the third doped region 603 within the first nanowires 901 and the fourth doped region 703 within the second nanowires 903 from the first gate electrode 1003 and the second gate electrode 1007. In an embodiment the third isolation region 1013 includes a dielectric material, such as silicon oxide. The third isolation region 1013 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material includes depositing a dielectric material using, e.g., CVD or PVD. An etch process may then be used to remove material of the third isolation region 1013 from the tops of the first nanowires 901 and the second nanowires 903.

A fourth isolation region 1015 may be formed over the third isolation region 1013 in order to provide additional isolation of the first gate electrode 1003 and the second gate electrode 1007 around the first nanowires 901 and the second nanowires 903 and also to provide a more planar surface for further processing than the third isolation region 1013 provides. In an embodiment the fourth isolation region 1015 may comprise a dielectric material applied using, e.g., a spin-on process that will fill in the spaces between the third isolation regions 907.

Once the third isolation region 1013 and the fourth isolation region 1015 have been formed, third contact pads 1017 may be formed in electrical connection with the first nanowires 901 and fourth contact pads 1019 may be formed in electrical connection with the second nanowires 903. In an embodiment the third contact pads 1017 and the fourth contact pads 1019 are formed in order to provide electrical connection between the third doped region 603 within the first nanowires 901 and contact (not separately illustrated in FIG. 10) and to provide electrical connection between the fourth doped region 703 within the second nanowires 903. In an embodiment the third contact pads 1017 and the fourth contact pads 1019 are formed of a conductive material such as aluminum, although other suitable materials, such as copper, tungsten, or the like, may alternatively be utilized. The third contact pads 1017 and the fourth contact pads 1019 may be formed using a process such as CVD or PVD, although other suitable materials and methods may alternatively be utilized. Once the material for the third contact pads 1017 and the fourth contact pads 1019 has been deposited, the material may be shaped into the third contact pads 1017 and the fourth contact pads 1019 using, e.g., a photolithographic masking and etching process.

After the third contact pads 1017 and the fourth contact pads 1019 have been formed, a fifth isolation region 1021 may be formed to help isolate the third contact pads 1017 and the fourth contact pads 1019. In an embodiment the fifth isolation region 1021 includes a dielectric material, such as silicon oxide in the present example. The fifth isolation region 1021 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using CVD, PVD, or a spin-on process. If desired, a CMP process may be utilized to planarize the fifth isolation region 1021.

In accordance with an embodiment, a method of manufacturing a semiconductor device comprising forming a first opening in a semiconductor substrate and epitaxially growing a first semiconductor material within the first opening is provided. The first semiconductor material is planarized with the semiconductor substrate. A second opening is formed in the first semiconductor material, and a second semiconductor material is epitaxially grown within the second opening. The second semiconductor material is planarized with the first semiconductor material, and a channel layer is epitaxially grown over the first semiconductor material and the second semiconductor material.

In accordance with another embodiment, a method of manufacturing a semiconductor device comprising embedding a dielectric material into a semiconductor substrate is provided. A first semiconductor material is embedded within the semiconductor substrate, wherein the embedding the first semiconductor material is performed at least in part using a first epitaxial growth process. A second semiconductor material is embedded into the semiconductor substrate, wherein the embedding the second semiconductor material is performed at least in part using a second epitaxial growth process different from the first epitaxial growth process and wherein the second semiconductor material is planar with the first semiconductor material. A channel layer is epitaxially grown onto the first semiconductor material and the second semiconductor material, wherein at least a portion of the channel layer extends over the dielectric material.

In accordance with yet another embodiment, a semiconductor device comprising a first conductive region embedded within a substrate, the first conductive region having a first conductivity is provided. A second conductive region is embedded within the substrate, the second conductive region having a second conductivity opposite the first conductivity, wherein the first conductive region, the second conductive region, and the substrate are planar with each other. A dielectric material is embedded within the substrate. A first channel region is in physical contact with the first conductive region, the first channel region comprising a first material. A second channel region is in physical contact with the second conductive region, the second channel region comprising the first material. A liner covers a first portion of the dielectric material, wherein the liner comprises the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first opening in a semiconductor substrate;
    epitaxially growing a first semiconductor material within the first opening;
    planarizing the first semiconductor material with the semiconductor substrate;
    forming a second opening in the first semiconductor material;
    epitaxially growing a second semiconductor material within the second opening;
    planarizing the second semiconductor material with the first semiconductor material; and
    epitaxially growing a channel layer over the first semiconductor material and the second semiconductor material.

2. The method of claim 1, further comprising forming a dielectric material within the semiconductor substrate prior to the epitaxially growing the channel layer, wherein the epitaxially growing the channel layer forms at least a portion of the channel layer extending over the dielectric material.

3. The method of claim 2, wherein the dielectric material is an alignment mark.

4. The method of claim 2, further comprising epitaxially growing a third semiconductor material over the channel layer.

5. The method of claim 4, further comprising forming a first nanowire from the first semiconductor material, the third semiconductor material, and the channel layer.

6. The method of claim 4, further comprising:
    forming a third opening in the third semiconductor material; and
    epitaxially growing a fourth semiconductor material within the third opening, wherein the fourth semiconductor material has the same conductivity as the second semiconductor material.

7. The method of claim 6, further comprising forming a second nanowire from the second semiconductor material, the fourth semiconductor material, and the channel layer.

8. A method of manufacturing a semiconductor device, the method comprising:
    embedding a dielectric material into a semiconductor substrate;
    embedding a first semiconductor material within the semiconductor substrate, wherein the embedding the first semiconductor material is performed at least in part using a first epitaxial growth process;
    embedding a second semiconductor material into the semiconductor substrate, wherein the embedding the second semiconductor material is performed at least in part using a second epitaxial growth process different from the first epitaxial growth process and wherein the second semiconductor material is planar with the first semiconductor material; and
    epitaxially growing a channel layer onto the first semiconductor material and the second semiconductor material, wherein at least a portion of the channel layer extends over the dielectric material.

9. The method of claim 8, further comprising epitaxially growing a third semiconductor material over the channel layer, wherein at least a portion of the third semiconductor material extends over the dielectric material.

10. The method of claim 9, further comprising:
    forming an opening within the third semiconductor material to expose the channel layer; and
    epitaxially growing a fourth semiconductor material within the opening.

11. The method of claim 10, further comprising patterning the first semiconductor material, the third semiconductor material, and the channel layer into a first nanowire and patterning the second semiconductor material, the fourth semiconductor material, and the channel layer into a second nanowire.

12. The method of claim 11, further comprising patterning the channel layer and the third semiconductor material to form a dummy bar.

13. The method of claim 11, further comprising forming a first vertical gate all around device from the first nanowire and forming a second vertical gate all around device from the second nanowire.

14. The method of claim 9, wherein the epitaxially growing a channel layer grows an undoped semiconductor material.

15. A method of manufacturing a semiconductor device, the method comprising:

depositing a first mask layer onto a semiconductor substrate;
using the first mask layer to pattern a first opening into the semiconductor substrate;
filling the first opening with a first epitaxial material using at least in part a first epitaxial growth process;
depositing a second mask layer onto the first epitaxial material;
using the second mask layer to pattern a second opening into the first epitaxial material;
filling the second opening with a second epitaxial material using at least in part a second epitaxial growth process;
growing a channel material on the first epitaxial material and the second epitaxial material using at least in part a third epitaxial growth process;
growing a third epitaxial material onto the channel material using at least in part a fourth epitaxial growth process;
depositing a third mask layer onto the third epitaxial material;
using the third mask layer to pattern a third opening into the third epitaxial material;
filling the third opening with a fourth epitaxial material using at least in part a fifth epitaxial growth process; and
patterning the third epitaxial material, the fourth epitaxial material, and the channel material to form a plurality of nanowires.

16. The method of claim 15, further comprising forming a dielectric region within the semiconductor substrate prior to the depositing the first mask layer.

17. The method of claim 16, wherein the growing the third epitaxial material grows the third epitaxial material over the dielectric region.

18. The method of claim 16, wherein the patterning the third epitaxial material, the fourth epitaxial material, and the channel material additionally forms a dummy nanowire.

19. The method of claim 15, wherein the plurality of nanowires further comprises:
a first nanowire with a first source, the first source having a first conductivity; and
a second nanowire with a second source, the second source having a second conductivity different from the first conductivity.

20. The method of claim 15, wherein the patterning the third epitaxial material, the fourth epitaxial material, and the channel material additionally patterns the first epitaxial material and the second epitaxial material.

* * * * *